(12) United States Patent
Kudelka et al.

(10) Patent No.: US 6,406,970 B1
(45) Date of Patent: Jun. 18, 2002

(54) BURIED STRAP FORMATION WITHOUT TTO DEPOSITION

(75) Inventors: Stephan Kudelka, Fishkill, NY (US); Helmut Horst Tews, Unterhaching (DE)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/945,007

(22) Filed: Aug. 31, 2001

(51) Int. Cl.[7] .......................................... H01L 21/8242
(52) U.S. Cl. ..................... 438/386; 438/243; 438/246; 438/248; 438/389; 438/391
(58) Field of Search ................................ 438/243, 245, 438/246, 247, 248, 249, 386, 388, 389, 390, 391, 392

(56) References Cited

U.S. PATENT DOCUMENTS 5,614,431 A * 3/1997 DeBrosse ................... 438/243
6,040,213 A * 3/2000 Canale et al. ............... 438/243
2001/0038113 A1 * 11/2001 Bronner et al. .............. 257/301
2001/0055846 A1 * 12/2001 Beckmann et al. .......... 438/243
2002/0016035 A1 * 2/2002 Wu et al. .................... 438/243

* cited by examiner

Primary Examiner—Mary Wilczewski
Assistant Examiner—Toniae M. Thomas
(74) Attorney, Agent, or Firm—Slater & Matsil, L.L.P.

(57) ABSTRACT

A process for forming a buried strap for memory cells of a semiconductor device having reduced process complexity and improved thickness control of the top trench oxide (TTO) (26). A first oxide layer (16) is deposited over a substrate (11) having trenches formed therein. A first semiconductor material (18) is deposited within the trenches (14). A nitride layer (20) is formed over exposed semiconductor substrate (20) within trenches (14), and a second semiconductor layer (22) is deposited over the nitride layer (20). The top surfaces of the second semiconductor layer (22) are doped to form doped regions (24) and leave undoped second semiconductor layer (22) on the trench (14) sidewalls. The undoped second semiconductor layer (22) is removed from the trench (14) sidewalls, and the doped semiconductor layer (24) within the trench (14) is oxidized to form an oxide region (26), which forms a TTO, within the doped second semiconductor layer (24).

21 Claims, 3 Drawing Sheets

BURIED STRAP FORMATION WITHOUT TTO DEPOSITION

TECHNICAL FIELD

The present invention relates generally to the fabrication of integrated circuits (IC's), and more particularly to the fabrication of memory IC's.

BACKGROUND OF THE INVENTION

Semiconductor devices are used in a variety of electronic applications, such as personal computers and cellular phones, for example. The semiconductor industry in general is being driven to decrease the size of semiconductor devices located on integrated circuits. Miniaturization is generally needed to accommodate the increasing density of circuits necessary for today's semiconductor products.

One semiconductor product widely used in electronic systems for storing data is a semiconductor memory device, and one common type of semiconductor memory device is a dynamic random access memory (DRAM). A DRAM typically includes millions or billions of individual DRAM cells arranged in an array, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

DRAM storage capacitors are typically formed by etching deep trenches in a substrate. A plurality of layers of conductive and insulating materials are deposited in order to produce a storage capacitor that is adapted to store a bit of data, represented by a one or zero. Prior art DRAM designs typically comprise an access FET disposed in a subsequent layer to the side of the storage capacitor. More recent DRAM designs involve disposing the access FET directly above the storage capacitor in the upper part of the trench, which conserves surface area, resulting in the ability to place more DRAM cells on a single chip.

An element known a buried strap is a conductive path that electrically couples a memory cell storage capacitor to the drain of an access transistor. In vertical access transistor technology, the capacitor is formed in the lower part of the trench, and the access transistor is formed in the upper part of the trench. A thick dielectric layer called trench top oxide (TTO) forms the electrical isolation between capacitor and transistor. The strap is buried below the wafer surface in the trench sidewall below the TTO. Dopant outdiffusion from the strap into the silicon sidewall creates a doped area and forms the drain of the access transistor. Prior art buried strap formation typically involves a trench top oxide deposition in the upper part of the trench. The typical TTO comprises tetraethoxysilane (TEOS) that, when deposited, is thicker on the bottom than on the sides. Having TEOS on the sides of the trenches of a DRAM storage cell is undesirable, and requires additional processing steps to remove the TTO from the trench sidewalls. A TTO sidewall etch typically requires a wet etch that causes the TTO remaining within the trench to have a high degree of non-uniformity. Furthermore, a TTO TEOS deposition does not permit adequate control of the thickness of the TTO. Precise thickness control of the TTO is necessary because the outdiffused area from the buried strap must, on one hand, extend above the vertical gate oxide of the access transistor, and on the other hand, it must not merge with outdiffused regions from neighboring trenches which causes floating body effects.

What is needed in the art is a method of forming a buried strap that allows for improved control of the TTO thickness and has a reduced number of processing steps than in prior art TEOS TTO depositions.

SUMMARY OF THE INVENTION

Embodiments of the present invention achieve technical advantages as a method forming a buried strap of a memory cell that does not require a TEOS deposition process for the formation of TTO. A semiconductor material is deposited over and within trenches. A vertical dopant implant dopes the top surface, and not the sidewalls, of the semiconductor material within the trenches. The undoped semiconductor material is removed from the trench sidewalls, and the doped semiconductor material remaining within the trenches is oxidized in a thermal oxidation process.

Disclosed is a method of manufacturing a semiconductor memory cell, comprising providing a semiconductor wafer having a substrate, forming a plurality of trenches in the substrate, forming capacitor structures in the lower part of the trenches and a collar oxide in the top part of the trench, , and filling the trench with a first semiconductor material. The method includes removing a top portion of the semiconductor material, leaving a portion of the first semiconductor material remaining within the trenches, and removing a top portion of the collar oxide layer. Using an overetch process, the collar oxide is recessed to a level below the top of the first semiconductor material within the trenches and forms a divot. The method includes forming a thin nitride layer over the exposed semiconductor substrate within the trenches, depositing a second semiconductor layer over the nitride layer, and exposing the wafer to a vertical dopant implantation process to dope the top surfaces and the horizontal surface inside the trench of the second semiconductor layer, leaving the second semiconductor layer undoped on the sidewalls of the trenches. The undoped second semiconductor layer is removed from the trench sidewalls, and the doped second semiconductor layer disposed over the first semiconductor material is oxidized.

Also disclosed is a method of forming a buried strap for a vertical DRAM having a plurality of trenches formed in a substrate on a semiconductor wafer. The method includes depositing a first oxide layer over the substrate, depositing a first semiconductor material in the trenches to a height below the top surface of the substrate, removing a top portion of the first oxide layer to a level below the top of the first semiconductor material within the trenches, and forming a nitride layer over the exposed semiconductor substrate on the trench sidewalls. The method includes depositing a second semiconductor layer over the nitride layer, doping the top surfaces of the second semiconductor layer, leaving the second semiconductor layer undoped on the trench sidewalls, removing the undoped second semiconductor layer from the trench sidewalls, and oxidizing the doped second semiconductor layer over the first semiconductor material to form an oxide region within the doped second semiconductor layer.

Further disclosed is a method of processing a semiconductor device, comprising depositing a first oxide layer over a substrate, the substrate having trenches formed therein. A first semiconductor material is deposited over the first oxide layer, and a top portion of the semiconductor material is removed, leaving a portion of the first semiconductor material remaining within the trenches. The method includes removing a top portion of the first oxide layer to a level below the top of the first semiconductor material within the trenches, forming a nitride layer over the exposed semiconductor substrate within the trenches, and depositing a second semiconductor layer over the nitride layer. The top surfaces of the second semiconductor layer are doped, leaving the second semiconductor layer undoped on the sidewalls of the trenches. The undoped second semiconductor layer is removed from the trench sidewalls, and the doped second semiconductor layer disposed over the first semiconductor material is oxidized.

Advantages of embodiments of the invention include providing a method of forming a buried strap that does not require a TEOS deposition or a sidewall wet etch to remove TEOS TTO from the trench sidewalls, as in the prior art. Embodiments of the present invention result in improved thickness control and uniformity of buried strap TTO, permit reduction of buried strap outdiffusion, and result in reduced floating body effects.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A description of preferred embodiments of the present invention will be discussed, followed by a discussion of some advantages of embodiments of the invention. A cross-section of one memory cell is shown in each figure, although many other memory cells and components of memory cells may be present in the semiconductor devices shown.

Figure 1:
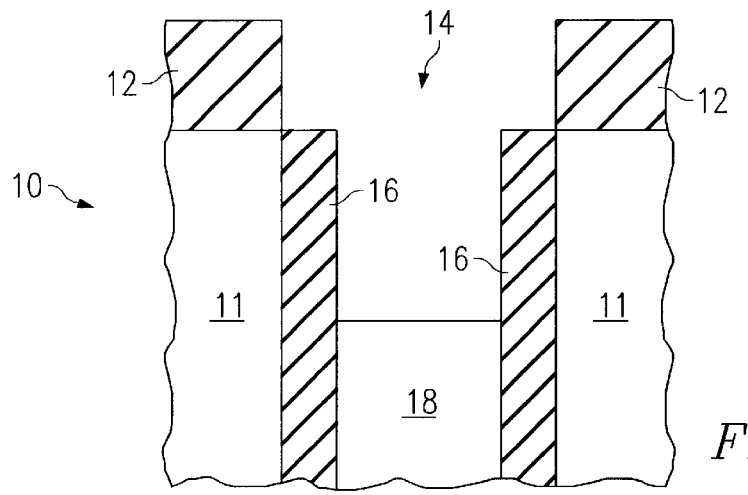
FIGS. 1–7 illustrate cross-sectional views of a semiconductor wafer at various stages in a process flow for forming a buried strap in accordance with an embodiment of the present invention.

Shown in FIG. 1, a semiconductor wafer 10 having a substrate 11 is provided. The substrate 11 typically comprises a semiconductor material such as single-crystal silicon, and may include other conductive layers or other semiconductor elements such as transistors or diodes, as examples. The substrate 11 may alternatively comprise compound semiconductors such as GaAs, InP, Si/Ge, SiC, as examples.

A pad nitride 12 is deposited over the semiconductor substrate 11. The pad nitride 12 preferably comprises silicon nitride deposited in a thickness of 100–300 nm. Alternatively, pad nitride 12 may comprise other nitrides or oxides, as examples.

A plurality of trenches 14 are formed in the semiconductor wafer 10. The trenches 14 may have a high aspect ratio, e.g., the depth may be much greater than the width. For example, trenches 14 may be 100 nm wide and 10 μm deep below the top surface of the substrate 11. Trenches 14 may have an oval shape when viewed from the top surface of the wafer 10, and alternatively, trenches 14 may comprise other shapes, such as square, rectangular, or circular, as examples. Trenches 14 may form a storage node or capacitor of a memory cell, such as in a DRAM, for example.

A first oxide layer 16 is deposited or formed within the top part of the trenches 14, as shown in FIG. 1. In the lower part of the trenches, storage capacitors may be formed. First oxide layer 16 preferably comprises silicon dioxide, and may comprise other insulative materials, as examples. First oxide layer 16 may be about 10 nm to 40 nm thick, for example. The first oxide layer 16 will function as a trench isolation collar for the DRAM storage cell that will be formed by trench 14 in a vertical DRAM, for example. The trench isolation collar serves to isolate devices on the wafer 10 from one another.

A first semiconductor material 18 is deposited within the trenches 14 over the first oxide layer 16. First semiconductor material 18 preferably comprises polysilicon deposited in a thickness of around 2000 Å, for example, and may alternatively comprise other semiconductor materials, for example. A chemical-mechanical polish (CMP) may be performed to remove the first semiconductor material 18 from the top surface of the wafer 10, and to planarize the wafer 10.

The first semiconductor material 18 is recessed or etched back from the top of the wafer 10 using a dry etch, as an example, to a depth within the trenches 14 below the top of the substrate 11 to a depth of, for example, 300–400 nm. Recessing the first semiconductor material 18 trench fill defines the channel lengths of the access transistor and leaves the trench isolation collar formed by first oxide layer 16 exposed, as shown in FIG. 1.

Figure 2:
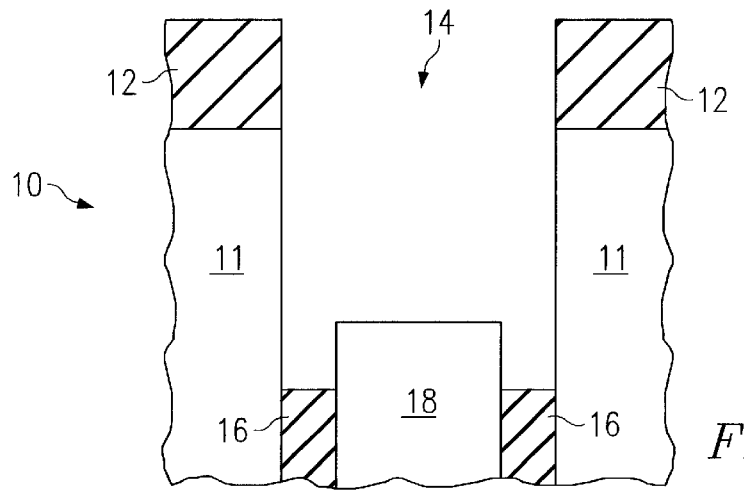

Next, a collar 16 divot etch is performed, as shown in FIG. 2. Preferably, a reactive ion etch (RIE) or wet etch is performed to removed the top portion of the first oxide layer 16 from the trench 14 sidewalls to a depth below the top of the first semiconductor material 18 within the trenches 14. Alternatively, other types of etches may be used for the collar 16 divot etch, for example.

Figure 3:
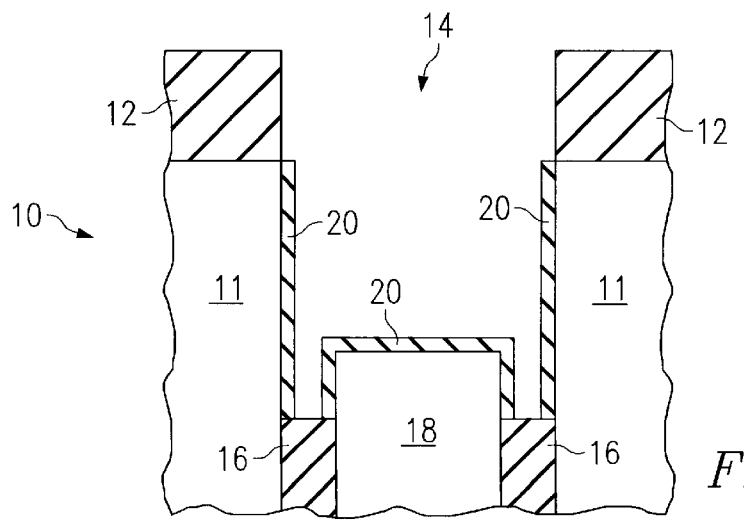

The wafer 10 is exposed to a nitridation process, as shown in FIG. 3, to form a thin nitride layer 20 on the trench 14 sidewalls. In the nitridation step, the nitride layer 20 will also be formed over the exposed surfaces of the first semiconductor material 18. Preferably, the nitridation process comprises an exposure to ammonia ($NH_3$) at an elevated temperature, for example, between about 500–800 degrees C. for a time period of between approximately 10–30 minutes. The ammonia reacts with the exposed semiconductor material of the substrate 11, such as silicon, to form a nitride layer 20 comprising 5–10 Å of silicon nitride, for example.

Figure 4:
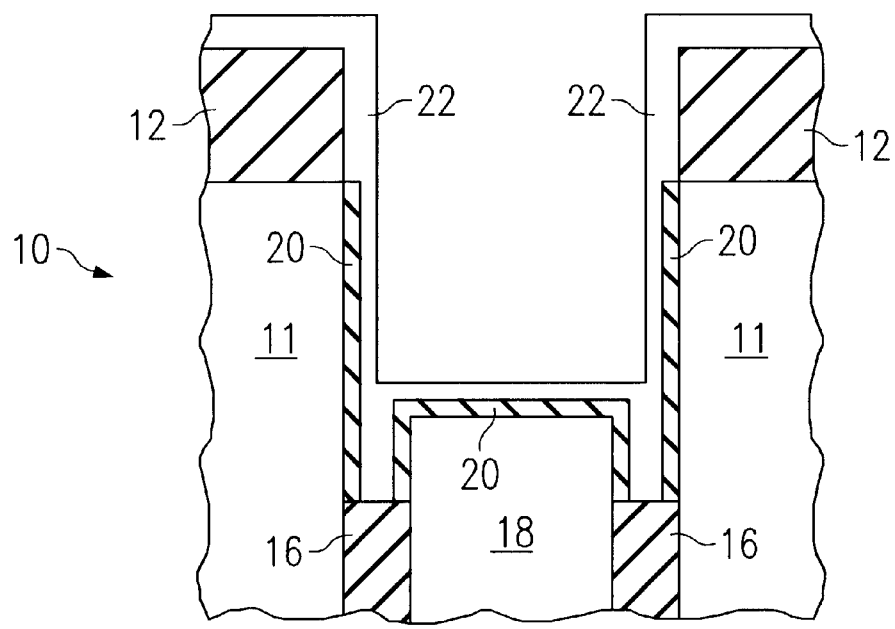

A strap polysilicon deposition is then performed on the wafer 10, as shown in FIG. 4. In the strap polysilicon deposition, a semiconductor material 22 is deposited, for example, by chemical vapor deposition (CVD) in a thickness of about 20–50 nm. Semiconductor material 22 may comprise amorphous silicon, and may alternatively comprise SiGe, as examples.

Figure 5:
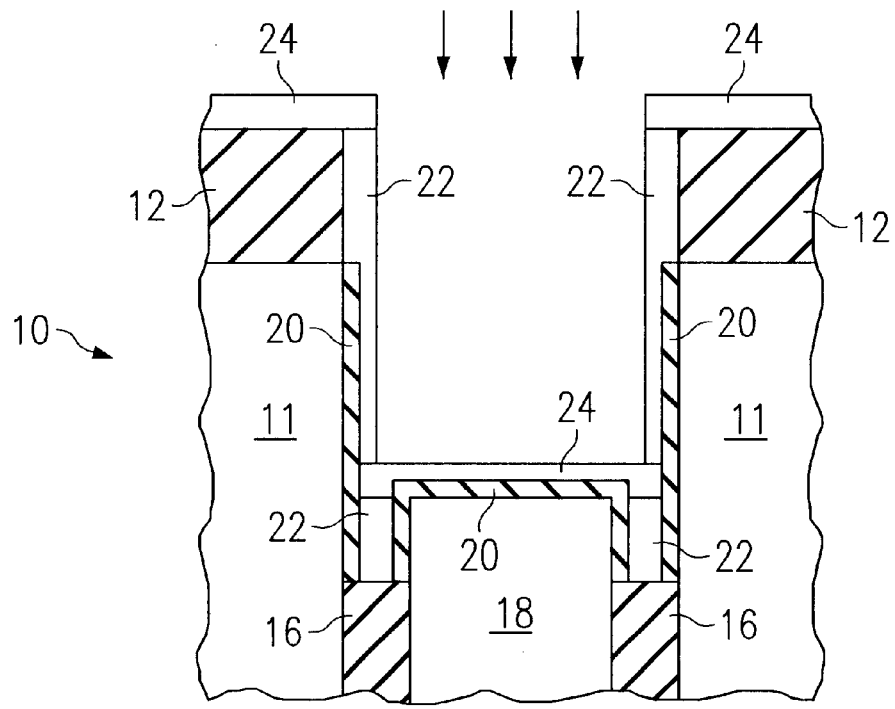

The wafer 10 is exposed to a straight ion implantation process, as shown in FIG. 5. An n or p dopant is used to form highly doped regions 24 within semiconductor material 22 in regions over the pad nitride 12 and in the bottom of the trenches 14. For n type doping, for example, arsenic or phosphorus may be used as the dopant, and for p type doping, boron may be used as the dopant, for example.

Preferably the doping of semiconductor material 22 comprises a directional vertical implantation. For example, the doping may occur in an accelerator with a voltage supplied to the wafer 10 and with the dopant source being at another voltage potential. The voltage differential creates a highly directional ion implantation process in order to dope the top surfaces of semiconductor material 22, without doping the sides of the trenches 14. Preferably, the trench 14 sidewalls remain undoped in accordance with an embodiment of the present invention.

Figure 6:
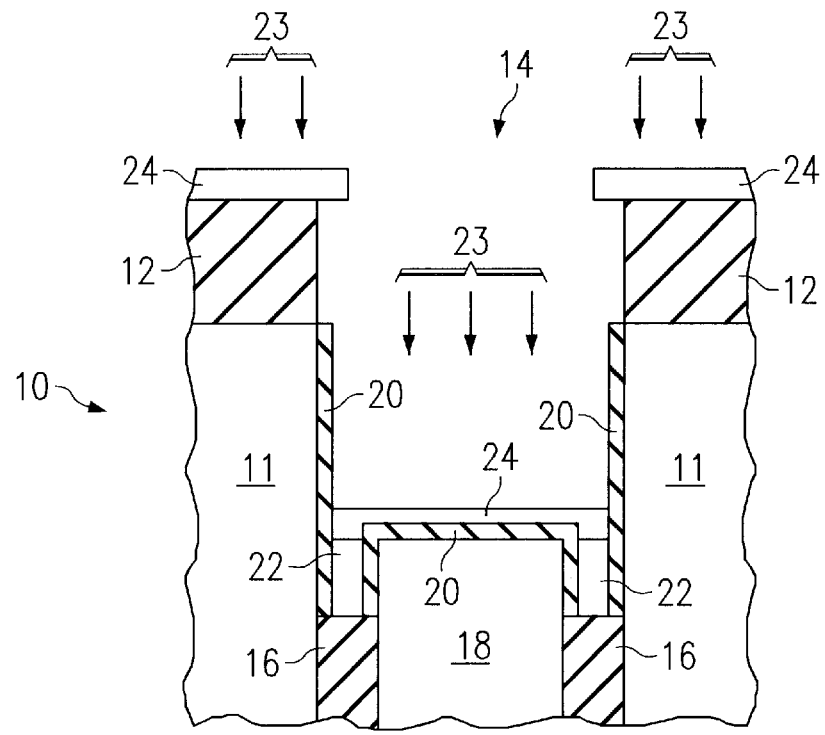

The wafer 10 is exposed to a wet etch process, as shown in FIG. 6, to remove the unimplanted (or undoped) strap silicon 22 from the sidewalls of the trenches 14. The wet etch etchant 23 preferably comprises standard semiconductor material 22 etches, as will be known to one skilled in the art. The wet etch preferably removes the undoped semiconductor material 22 from the trench 14 sidewalls, while leaving doped semiconductor material 24 remaining within the bottom of the trenches 14 over semiconductor material 18. The nitride layer 20 remains on the trench 14 sidewalls at the conclusion of the wet etch step.

Figure 7:
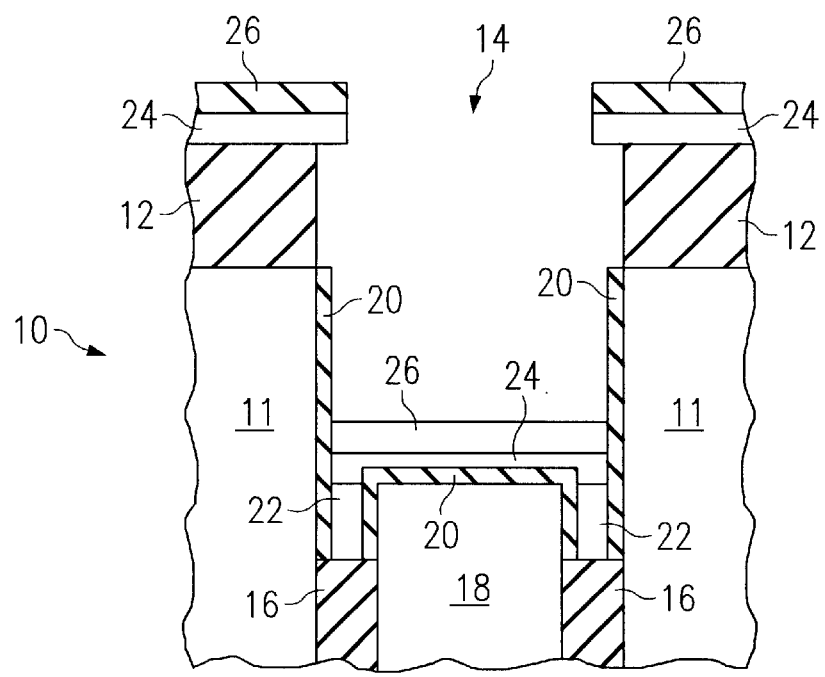

The doped semiconductor material 24 is oxidized, preferably in an oxidation process selective to the nitrided silicon trench 14 sidewall, as shown in FIG. 7, to form oxide region 26 on the top surface of doped semiconductor material 24. In the oxidation process, the wafer 10 is preferably exposed to a thermal oxidation process, for example, comprising a dry or wet oxidation at temperature range of 800–1000 degrees C. Rather than depositing an oxide in a TTO deposition step as in the prior art, the layer 24 is exposed to oxygen to form an oxide region 26 within layer 24. Preferably, oxidizing the doped second semiconductor layer 24 comprises forming an oxide region 26 having a thickness ranging between about 20 and 30 nm, for example. The wafer 10 is further processed to complete the fabrication of the memory device.

While embodiments of the present invention are described herein with reference to a DRAM, they also have useful application in ferroelectric random access memory (FRAM) devices and other semiconductor devices.

Embodiments of the present invention provide several advantages over prior art TTO deposition processes for forming buried strap regions of memory semiconductors. The buried strap TTO is formed by a thermal oxidation step, rather than by a deposition of the TTO with a TEOS layer, as in the prior art. Prior art TTO TEOS deposition includes depositing silicon dioxide on sidewalls of the trench as well as on the bottom, which is disadvantageous because the silicon dioxide must then be removed from the sidewall of the trenches. The processing step required to remove the trench sidewall oxide causes mechanical stress within the trench and can lead to device failures. A processing step to remove oxide from the trench 14 sidewalls is eliminated by use of embodiments of the invention. Furthermore, the wafer 10 is not subject to the mechanical stresses of a sidewall oxide removal step, and therefore embodiments of the present invention experience fewer device failures.

Embodiments of the present invention also provide the ability to form a controlled thickness of the oxide region 26 of layer 24 with improved thickness uniformity. The improved thickness control of the trench top oxide 26 allows the use of thinner TTO thicknesses as compared to the prior art processes and provides reduction of buried strap outdiffusion, therefore reducing floating body effects. Furthermore, a thinner TTO 26 can be manufactured in accordance with embodiments of the invention, because a single well—controlled oxidation process, e.g. thermal oxidation, is used, rather than a deposition process followed by an etch step.

The embodiments of the present invention also require reduced process complexity than prior art top trench oxide formation processes because removing TTO from the sidewalls is not required. Memory devices may be scaled down in size in accordance with the thinner and more controlled TTO thickness provided by embodiments of the present invention.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a semiconductor memory cell, comprising:

providing a semiconductor wafer having a substrate;

forming a plurality of trenches in the substrate, the trenches including sidewalls;

depositing a first oxide layer over the substrate;

depositing a first semiconductor material over the first oxide layer;

removing a top portion of the semiconductor material, leaving a portion of the first semiconductor material remaining within the trenches;

removing a top portion of the first oxide layer to a level below the top of the first semiconductor material within the trenches;

forming a nitride layer over the exposed semiconductor substrate within the trenches;

depositing a second semiconductor layer over the nitride layer;

exposing the wafer to a vertical dopant implantation process to dope the top surfaces of the second semiconductor layer, leaving the second semiconductor layer undoped on the sidewalls of the trenches;

removing the undoped second semiconductor layer from the trench sidewalls; and oxidizing the doped second semiconductor layer disposed over the first semiconductor material.

2. The method according to claim 1, wherein oxidizing the doped second semiconductor layer comprises forming an oxide region within the doped second semiconductor material.

3. The method according to claim 2 wherein oxidizing the doped second semiconductor layer comprises forming an oxide region having a thickness ranging between about 20 and 30 nm.

4. The method according to claim 2, wherein oxidizing the doped second semiconductor layer comprises exposing the wafer to a thermal oxidation process.

5. The method according to claim 4 wherein the thermal oxidation process is at a temperature of between about 800 to 1000 degrees C.

6. The method according to claim 4 wherein exposing the wafer to a thermal oxidation process comprises exposing the wafer to a dry or wet oxidation process.

7. The method according to claim 1, wherein forming a nitride layer comprises exposing the wafer to ammonia at a temperature of about 500 to 800 degrees.

8. The method according to claim 1, wherein the first semiconductor material and second semiconductor layer comprise polysilicon, the nitride layer comprises SiN, and the first oxide layer comprises $SiO_2$.

9. The method according to claim 1, wherein the memory cell comprises a memory cell of a dynamic random access memory (DRAM).

10. A method of forming a buried strap for a vertical dynamic random access memory (DRAM) having a plurality of trenches formed in a substrate on a semiconductor wafer, the trenches comprising sidewalls, the method comprising:

depositing a first oxide layer over the substrate;

depositing a first semiconductor material in the trenches to a height below the top surface of the substrate;

removing a top portion of the first oxide layer to a level below the top of the first semiconductor material within the trenches;

forming a nitride layer over the exposed semiconductor substrate on the trench sidewalls;

depositing a second semiconductor layer over the nitride layer;

doping the top surfaces of the second semiconductor layer, leaving the second semiconductor layer undoped on the trench sidewalls;

removing the undoped second semiconductor layer from the trench sidewalls; and oxidizing the doped second semiconductor layer over the first semiconductor material to form an oxide region within the doped second semiconductor layer.

11. The method according to claim 10, wherein doping the top surfaces of the second semiconductor layer comprises a vertical doping process.

12. The method according to claim 10, wherein oxidizing the doped second semiconductor layer comprises exposing the wafer to a thermal oxidation process.

13. The method according to claim 12, wherein the thermal oxidation process is at a temperature between about 800 to 1000 degrees C.

14. The method according to claim 12 wherein exposing the wafer to a thermal oxidation comprises a dry or wet oxidation process.

15. The method according to claim 10 wherein oxidizing the doped second semiconductor layer comprises forming an oxide region having a thickness ranging between about 20 and 30 nm.

16. The method according to claim 10, wherein forming a nitride layer comprises exposing the wafer to ammonia at a temperature of about 500 to 800 degrees.

17. The method according to claim 10, wherein the first semiconductor material and second semiconductor layer comprise polysilicon, the nitride layer comprises SiN, and the first oxide layer comprises $SiO_2$.

18. A method of processing a semiconductor device that includes at least one trench formed within a substrate, the trenches including sidewalls, the method comprising:

depositing a first oxide layer over the substrate;

depositing a first semiconductor material over the first oxide layer;

removing a top portion of the semiconductor material, leaving a portion of the first semiconductor material remaining within the trenches;

removing a top portion of the first oxide layer to a level below the top of the first semiconductor material within the trenches;

forming a nitride layer over the exposed semiconductor substrate within the trenches;

depositing a second semiconductor layer over the nitride layer;

doping the top surfaces of the second semiconductor layer, leaving the second semiconductor layer undoped on the sidewalls of the trenches;

removing the undoped second semiconductor layer from the trench sidewalls; and oxidizing the doped second semiconductor layer disposed over the first semiconductor material.

19. The method according to claim 18, wherein doping the top surfaces of the second semiconductor layer comprises exposing the wafer to a vertical dopant implantation process.

20. The method according to claim 19, wherein oxidizing the doped second semiconductor layer comprises exposing the wafer to a thermal oxidation process.

21. The method according to claim 20, wherein the semiconductor device comprises a dynamic random access memory (DRAM).

* * * * *

UNITED STATES PATENT AND TRADEMARK OFFICE
CERTIFICATE OF CORRECTION

PATENT NO. : 6,406,970 B1
DATED : June 18, 2002
INVENTOR(S) : Kudelka et al.

It is certified that error appears in the above-identified patent and that said Letters Patent is hereby corrected as shown below:

<u>Title page,</u>
Item [73], Assignee, "Infineon Technologies North America Corp., San Jose, CA (US)" should read -- Infineon Technologies AG, Munich, Germany --.

Signed and Sealed this

Twenty-fourth Day of June, 2003

JAMES E. ROGAN
*Director of the United States Patent and Trademark Office*